(12) United States Patent
Ji et al.

(10) Patent No.: US 10,156,598 B2
(45) Date of Patent: *Dec. 18, 2018

(54) BI-DIRECTIONAL ELECTRIC ENERGY METER

(71) Applicant: TEXAS INSTRUMENTS INCORPORATED, Dallas, TX (US)

(72) Inventors: Rujun Ji, Shanghai (CN); Cong Deng, Nanjing (CN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/615,867

(22) Filed: Jun. 7, 2017

(65) Prior Publication Data
US 2017/0269135 A1  Sep. 21, 2017

Related U.S. Application Data

(63) Continuation of application No. 14/698,586, filed on Apr. 28, 2015, now Pat. No. 9,702,912, and a
(Continued)

(51) Int. Cl.
*G01R 22/10* (2006.01)
*G01R 22/06* (2006.01)
*G01R 19/25* (2006.01)

(52) U.S. Cl.
CPC .......... *G01R 22/10* (2013.01); *G01R 22/063* (2013.01); *G01R 19/2513* (2013.01)

(58) Field of Classification Search
CPC .............................. G01R 22/10; G01R 22/063
See application file for complete search history.

(56) References Cited

U.S. PATENT DOCUMENTS 6,058,354 A   5/2000  Adame et al.
6,407,691 B1  6/2002  Yu
(Continued)

FOREIGN PATENT DOCUMENTS

CN   202563006       11/2012
EP   2658277 A2      10/2013
(Continued)

OTHER PUBLICATIONS

Extended European Search Report, Application No. 14908780.1, dated Dec. 1, 2017 (10 pages).

*Primary Examiner* — Clayton E Laballe
*Assistant Examiner* — Jas Sanghera
(74) *Attorney, Agent, or Firm* — Ebby Abraham; Charles A. Brill; Frank D. Cimino

(57) ABSTRACT

An electric energy meter for a poly-phase electricity network includes a power transformer having a primary side and a secondary side, a first analog front end (AFE) unit is coupled to the secondary side of the power transformer, and a microcontroller coupled to the primary side of the power transformer. The first AFE unit is to be coupled to a first phase of the poly-phase electricity network. The microcontroller is configured to transmit a digitized request signal to, and to receive a measurement signal from, the first AFE unit via the power transformer. More specifically, the first AFE unit, upon receiving the digitized request signal, is to extract information from the digitized request signal.

9 Claims, 3 Drawing Sheets

Related U.S. Application Data continuation of application No. PCT/CN2014/094962, filed on Dec. 25, 2014.

(56) References Cited

U.S. PATENT DOCUMENTS

| | | |
|---|---|---|
| 7,337,081 B1 | 2/2008 | Kagan |
| 7,554,319 B1 | 6/2009 | Li et al. |
| 9,702,912 B2 * | 7/2017 | Ji .................... G01R 22/10 |
| 2009/0115509 A1 | 5/2009 | Minteer |
| 2009/0212759 A1 | 8/2009 | Melanson |
| 2010/0023283 A1 | 1/2010 | Boutorabi et al. |
| 2014/0097691 A1 | 4/2014 | Jackson et al. |
| 2014/0232369 A1 | 8/2014 | Hogan |

FOREIGN PATENT DOCUMENTS

| | | |
|---|---|---|
| GB | 2431475 A | 4/2007 |
| KR | 20030057236 | 7/2003 |
| WO | WO9113417 | 9/1991 |

\* cited by examiner

BI-DIRECTIONAL ELECTRIC ENERGY METER

CROSS-REFERENCE TO RELATED APPLICATION(S)

This continuation application claims priority to U.S. patent application Ser. No. 14/698,586, filed Apr. 28, 2015, which is a continuation of copending International Application No. PCT/CN2014/094962, with an international filing date of Dec. 25, 2014, which designated the United States, both applications of which are hereby fully incorporated herein by reference for all purposes.

BACKGROUND

An electric energy meter is used to measure how much electrical energy a load has consumed from a source. Generally, the electric energy meter is coupled to an electricity network that connects between the load and source.

SUMMARY

Systems and methods to measure electric energy using the invented electric energy meter are disclosed herein. In an embodiment, an electric energy meter for a poly-phase electricity network includes a power transformer having a primary side and a secondary side, a first analog front end (AFE) unit is coupled to the secondary side of the power transformer, and a microcontroller coupled to the primary side of the power transformer. The first AFE unit is to be coupled to a first phase of the poly-phase electricity network. The microcontroller is configured to transmit a digitized request signal to, and to receive a measurement signal from, the first AFE unit via the power transformer. More specifically, the first AFE unit, upon receiving the digitized request signal, is to extract information from the digitized request signal.

In another embodiment, an apparatus for a poly-phase electricity network includes a power transformer having a primary side and a secondary side, a first plurality of analog front end (AFE) units coupled to the secondary side of the power transformer, a second plurality of AFE units coupled to the secondary side of the power transformer, and a microcontroller coupled to the primary side of the power transformer. More specifically, each of the first plurality of AFE units is to be coupled to a separate phase of the poly-phase electrical distribution and configured to measure current for that particular phase. Each of the second AFE units is to be coupled to a separate phase of the poly-phase electricity network and configured to measure voltage for that particular phase. The microcontroller is configured to transmit a digitized request signal to each of the first and second AFE units and to receive measurement data from the first and second AFE units via the power transformer. One of the first plurality of AFE units and one of the second plurality of AFE units are to be coupled to each phase.

Yet in another embodiment, a method includes transmitting, by a microcontroller coupled to a primary side of a power transformer, a digitized request signal to a plurality of analog front end (AFE) units, wherein each AFE unit is coupled between a secondary side of the power transformer and one phase of poly-phase electricity network, upon receiving the digitized request signal, activating the plurality of AFE units, measuring, by a first AFE unit, a first phase of current of a poly-phase electrical distribution, measuring, by a second AFE unit, the first phase of voltage of the poly-phase electrical distribution, and transmitting, by the first and second AFE units, the measured current and voltage for the first phase of the poly-phase electrical distribution to the microcontroller.

BRIEF DESCRIPTION OF THE DRAWINGS

For a detailed description of exemplary embodiments of the invention, reference will now be made to the accompanying drawings in which.

NOTATION AND NOMENCLATURE

Figure 1:
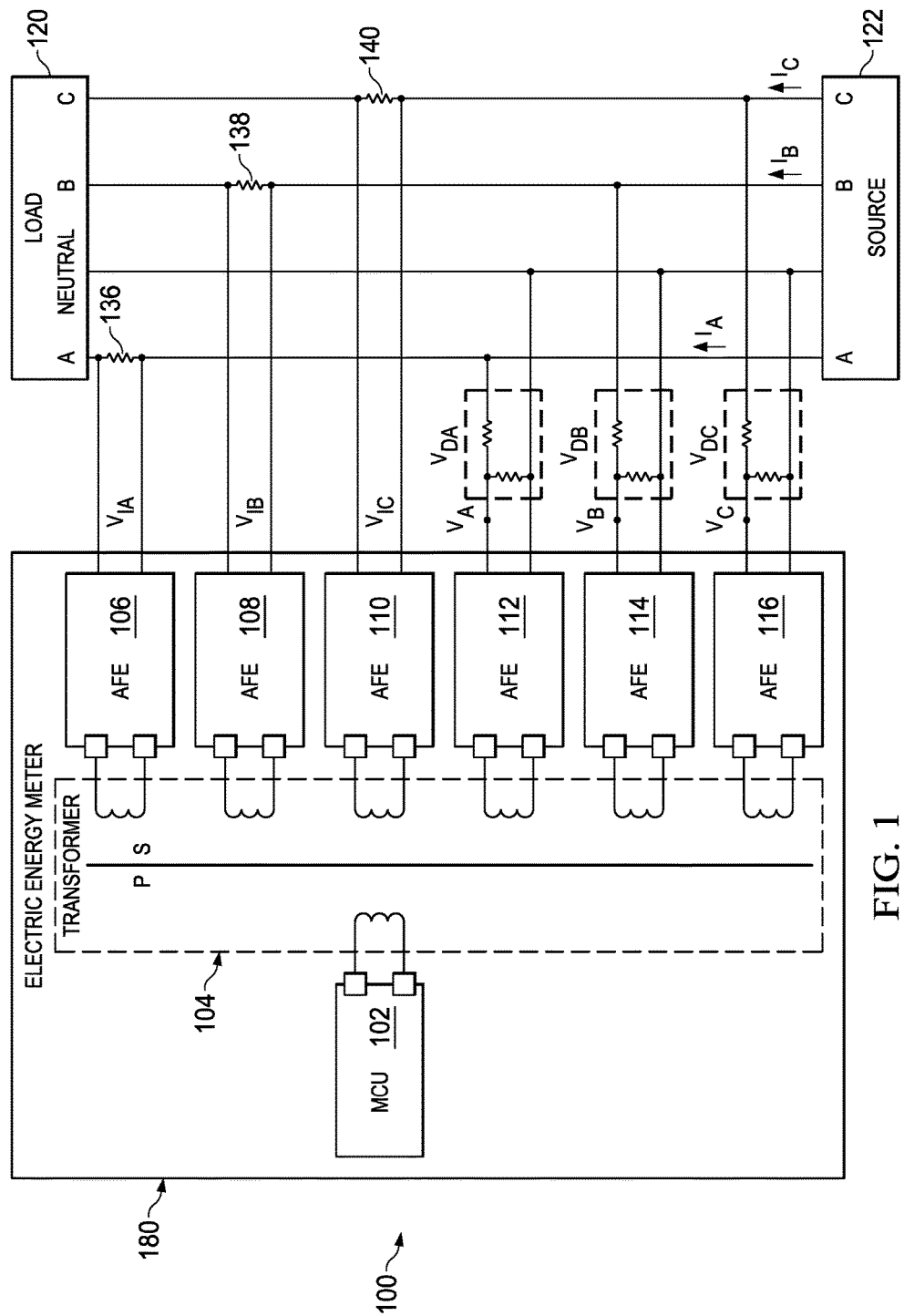
FIG. 1 shows a block diagram to illustrate an electric energy meter coupled to a poly-phase electricity network in accordance with various embodiments.

Certain terms are used throughout the following description and claims to refer to particular system components. As one skilled in the art will appreciate, companies may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . " Also, the term "couple" or "couples" is intended to mean either an indirect or direct connection. Thus, if a first device couples to a second device, that connection may be through a direct connection, or through an indirect connection via other devices and connections.

DETAILED DESCRIPTION

The following discussion is directed to various embodiments of the invention. Although one or more of these embodiments may be preferred, the embodiments disclosed should not be interpreted, or otherwise used, as limiting the scope of the disclosure, including the claims. In addition, one skilled in the art will understand that the following description has broad application, and the discussion of any embodiment is meant only to be exemplary of that embodiment, and not intended to intimate that the scope of the disclosure, including the claims, is limited to that embodiment.

Electric energy meters receive current and voltage input signals from the electricity network. In a typical poly-phase (e.g., three-phase) electric energy meter, current input signals for the three phases come from a three-phase electricity network via current transformers and voltage input signals come from the three phases of the electricity network via resistive voltage dividers. The current and voltage input signals are sampled by the meter and the current samples are multiplied with the voltage samples to obtain electric power samples. Accumulating these energy samples over time provides an indication of consumed electric power (energy).

Further, some electric energy meters convert the current and voltage input signals to digital input samples for further processing by a microcontroller. Generally, separate input channels in the meter are used for each of the three current and voltage input signals, and each input channel includes its own analog front end (AFE) unit, current transformer and/or a voltage divider. This approach is generally referred to as a synchronous approach since all input signals are processed in parallel and synchronously. With this approach, each AFE unit for each input channel is coupled to the electricity network via a dedicated current transformer (in the case of AFEs receiving current inputs) to avoid a mismatch issue. The AFE units are typically integrated with the microcontroller meaning that the microcontroller may have dedicated inputs for each of the AFE units. The dedicated AFE units and current transformers may cause an increased complexity to design the microcontroller, and may in turn possess a large die size. Since the die size may be a premium, such an approach may disadvantageously increase the cost of production.

The disclosed embodiments are directed to an electric energy meter that eliminates the requirement to integrate AFE units with a microcontroller. The microcontroller of the disclosed meter communicates with the AFE units via a communication medium and thus each of the microcontrollers and AFE units have individual connections to the communication medium. As such, the microcontroller does not have separate connections to each of the various AFE units. In the example disclosed herein, the communication medium is a single transformer. Implementing the disclosed meter to measure electric energy may advantageously provide a less complex design of the microcontroller and thus reduce the cost.

The disclosed electric energy meter may not be limited to be used for a poly-phase electricity network. In accordance with various embodiments, the meter may also be used in a single-phase electricity network.

FIG. 1 shows a block diagram 100 to illustrate a three-phase electric energy meter 180 in accordance with various embodiments. The illustrative electric energy meter 180 is connected to three phases A, B, C of a three-phase power source 122 which feeds a three-phase load 120. As noted above, although the disclosed electric energy meter 180 shown in FIG. 1 is a three-phase electric energy meter, the disclosed electric energy meter 180 may be connected to a poly-phase electricity network or a single-phase electricity network. For clarity, the following discussion will be limited to implement the electric energy meter 180 for three-phase electricity network. However, for the electric energy meter connected to a single-phase electricity network, the operation principle will be separately provided with respect to the block diagram of FIG. 3.

Still referring to FIG. 1, the illustrative electric energy meter 180 further includes a microcontroller unit (MCU) 102, a transformer 104, six AFE units 106, 108, 110, 112, 114, and 116. In accordance with illustrative embodiments, the transformer 104 includes primary (P) and secondary (S) sides. The MCU 102 connects to the primary side and the AFE units 106, 108, 110, 112, 114, and 116 connect to the secondary side.

Since the electric energy meter 180 is configured to measure the electric energy with three phases A, B, and C, in an embodiment, each phase includes a current signal and a voltage signal. For example, phase A includes a current signal $I_A$, phase B includes a current signal $I_B$, and phase C includes a current signal $I_C$. Further, the current and voltage signals at each phase are coupled to the AFE units via a resistive element (e.g., 136, 138, and 140) and a voltage divider (e.g., $V_{DA}$, $V_{DB}$, and $V_{DC}$) respectively. More specifically, the current signal $I_A$, corresponding to the phase A, is converted to a voltage signal $V_{IA}$ via the resistive element 136, and the voltage signal is received by the AFE unit 106. The current signal $I_B$, corresponding to the phase B, is converted to a voltage signal $V_{IB}$ via the resistive element 138, and the voltage signal is received by the AFE unit 108. The current signal $I_C$, corresponding to the phase C, is converted to a voltage signal $V_{IC}$ via the resistive element 140, and the voltage signal is received by the AFE unit 110. Still more specifically, via the voltage divider, the voltage signal at each phase is converted to a voltage (e.g., $V_A$, $V_B$, and $V_C$) that the corresponding AFE unit is configured to receive. For example, the AFE unit 112 is configured to receive $V_A$ that corresponds to the phase A via the voltage divider $V_{DA}$. The AFE unit 114 is configured to receive $V_B$ that corresponds to the phase B via the voltage divider $V_{DB}$. The AFE unit 116 is configured to receive $V_C$ that corresponds to the phase C via the voltage divider $V_{DC}$.

Continuing in FIG. 1, in accordance with various embodiments, the transformer 104 is a digital transformer that is configured to transmit digital signals between the primary and secondary sides of the transformer. Moreover, the transformer 104 is preferably to be implemented as a circuit integrated on a printed circuit board (PCB).

Figure 2:
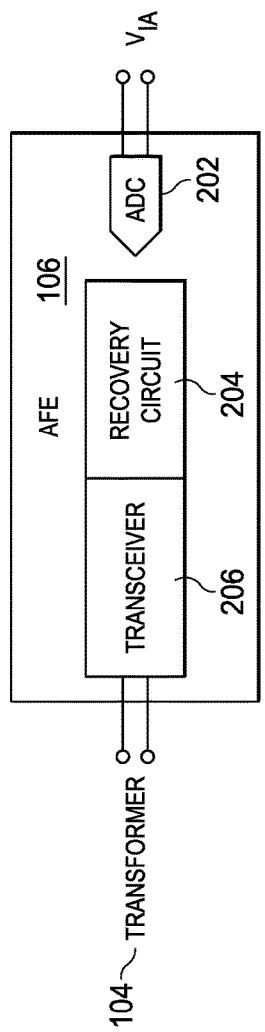
FIG. 2 shows an example to further illustrate an analog front end (AFE) unit in accordance with various embodiments.

FIG. 2 shows an example to further illustrate the AFE unit 106 in accordance with various embodiments. The other AFE units of FIG. 1 may share the same architecture and operating principle as AFE unit 106. As shown in FIG. 2, the AFE unit 106 further includes an analog-digital-conversion (ADC) unit 202, a recovery circuit 204, and a transceiver 206.

More specifically, the ADC unit 202 is coupled to the electricity network and configured to digitize the input voltage ($V_{IA}$). The transceiver 206 is coupled to the secondary side of the transformer 104 and is configured to receive/transmit signals to and from the MCU 102 through transformer 104. The recovery circuit 204 coupled to the transceiver 206 is configured to recover the signal received by the transceiver 206. Further, the recovery circuit 204 extracts information such as clock and data information from the recovered signal.

Generally, the clock information is used to synchronize each AFE unit. In some embodiments, the extracted data may include executed instructions. Such executed instructions, together with the clock information, may be used by the MCU 102 to specify which AFE unit is to retrieve current or voltage signals from the electricity network and which AFE unit is operable to transmit digitized current or voltage signals back to the MCU 102.

For example, based on the extracted clock and data information (extracted by the recovery circuit 204), the AFE unit 106 is assigned by the MCU 102 to retrieve $V_{IA}$ and digitize the retrieved $V_{IA}$ during a first minute. During a subsequent minute, the AFE unit 106 may be assigned by the MCU 102 to transmit the digitized $V_{IA}$ (by the transceiver 206) to the MCU 102 via the transformer 104. In accordance with illustrative embodiments, each of the AFE units 106, 108, 110, 112, 114, and 116 is operable either to retrieve and digitize current or voltage signals or to transmit the digitized signals via the transformer 104 to the MCU 102. Through the transformer 104, the MCU 102 can sequentially communicate with each AFE unit 106-116. Further details of the operation of the electric energy meter 180 will be discussed with respect to the flow chart in FIG. 4.

Figure 3:
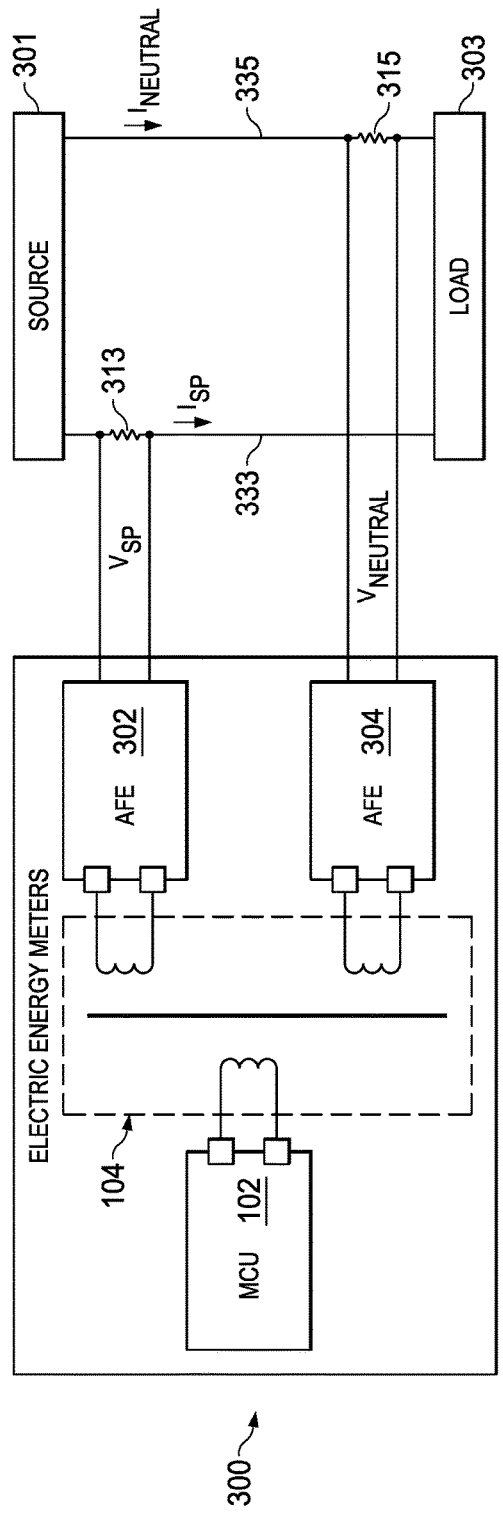
FIG. 3 shows an example to illustrate an electric energy meter coupled to a single-phase electricity network in accordance with various embodiments.

FIG. 3 shows an alternative example to illustrate an electric energy meter 300 to be coupled to a single-phase electricity network. In FIG. 3, the electric energy meter 300 is connected to the single-phase electricity network in which a source 301 feeds power to a load 303 via a single-phase line 333 and a neutral line 335.

The electric energy meter 300 is configured to estimate the single-phase electric energy consumption by measuring current signals flowing through the lines 333 and 335. The current signal flowing through the line 333 is $I_{sp}$; the current signal flowing through the neutral line is $I_{neutral}$. More specifically, the electric energy meter 300 receives measured voltage signals, $V_{sp}$ and $V_{neutral}$, which are converted, by the resistive element 313 and 315 respectively, from the current signals $I_{sp}$ and $I_{neutral}$.

Still referring to FIG. 3, the electric energy meter 300 is implemented with an architecture that is similar to that of the electric energy meter 180 of FIG. 1. As shown in FIG. 3, the electric energy meter 300 includes the MCU 102, the transformer 104, and AFE units 302 and 304. In some illustrative embodiments, the AFE units 302 and 304 are connected the secondary side of the transformer 104, and the MCU 102 is connected to the primary side of the transformer 104.

The AFE unit 302 is configured to receive the converted voltage signal $V_{sp}$ (which represents current $I_{sp}$) and further digitizes the received voltage signals $V_{sp}$. The AFE unit 304 is configured to receive the converted voltage signals $V_{neutral}$ (representing $I_{neutral}$) and further digitizes the received voltage signals $V_{neutral}$. For a purpose of clear illustration, only the AFE units (i.e., 302 and 304) configured to receive the converted current signals (i.e., $I_{sp}$ and $I_{neutral}$) are shown. That is, other AFE units may be included in meter 300 but may be unused.

In accordance with various embodiments, the operation of the electric energy meter 300 is similar to the one of the electric energy meter 180. The MCU 102 starts to transmit a digitized request signal to the AFE units via the transformer 104.

Figure 4:
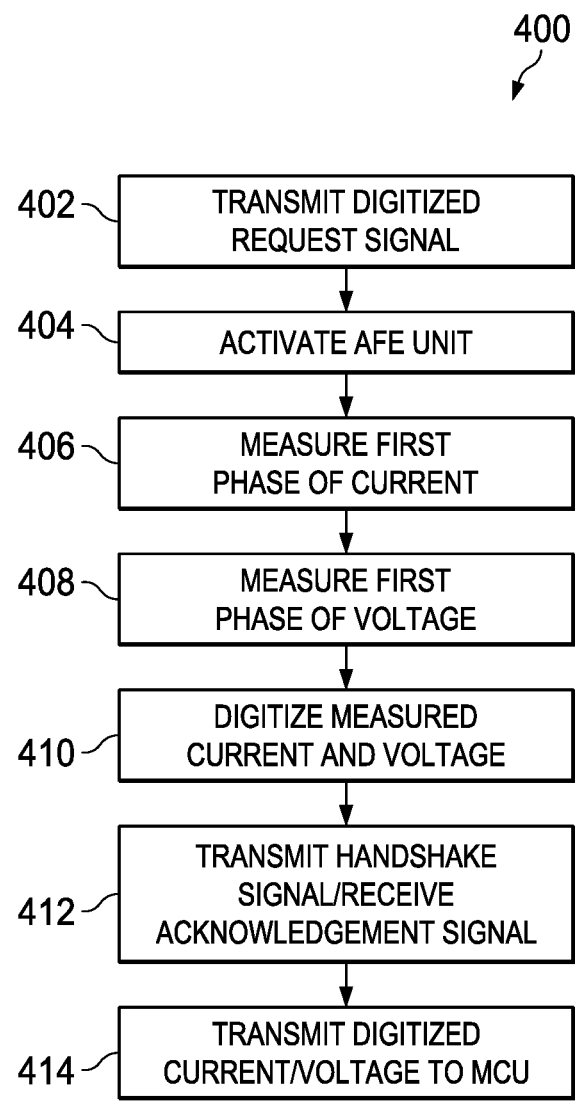
FIG. 4 shows a flow chart illustrating a method to measure electric energy using the disclosed electric energy meter in accordance with various embodiments.

FIG. 4 shows a flow chart for a method 400 using the disclosed electric energy meter to measure electric energy in accordance with various embodiments. The operations may be performed in the order shown, or in a different order. Further, two or more of the operations may be performed in parallel instead of sequentially.

The method 400 starts in block 402 by transmitting, by the MCU 102, a digitized request signal to one of the AFE units. In accordance with illustrative embodiments, the digitized request signal transmitted via the transformer 104 includes power, and information of data and clock. As mentioned above, the information may include a variety of instructions for the AFE unit to execute and the information of clock is operable to synchronize the AFE unit with the MCU 102.

After the AFE unit receives the request signal, the method continues in block 404 with activating the AFE unit. More specifically, once the AFE unit receives the request signal, the AFE unit is activated by the power of the request signal. The activated AFE unit is configured to recover the request signal so as to extract the information of data and clock. Preferably, the recovery and extraction is performed by the recovery circuit (e.g., 204) of the AFE unit.

Still referring to FIG. 4, after the AFE unit extracts the information of data and clock, the AFE unit is synchronized with the MCU 102 based on the extracted information of clock. Further, the AFE unit is configured to execute the extracted information of data (instructions). Executing the instruction leads the method 400 to block 406 in which current signals for a first phase are measured. Subsequently, the MCU 102 may transmit another digitized request signal to another AFE unit to activate the AFE unit. Then the method 400 continues at block 408 with measuring voltage signals for the first phase. More specifically, the measurement of voltage and current signals are performed by the AFE units to receive converted voltage signals (e.g., $V_{IA}$, $V_{IB}$, $V_{IC}$, $V_A$, $V_B$, and $V_C$) from the electricity network.

For example, the MCU 102 transmits a first digitized request signal to the AFE unit 106 via the transformer 104. The AFE unit 106 receives and decodes and extracts the instruction from the first digitized request signal. The AFE unit 106 AFE unit 106 then begins to receive $V_{IA}$ for the phase A of the electricity network. Subsequent to the MCU 102 transmitting the first digitized request signal, the MCU 102 may transmit a second digitized request signal to the AFE unit 112. Analogously, the AFE unit 112 is configured to start to receive $V_A$ from the electricity network.

After the AFE units receives converted voltage signals (e.g., $V_{IA}$ and $V_A$) from the electricity network in block 406 and 408, the method 400 continues at block 410 with digitizing the voltage signals. In some embodiments, the ADC unit of each AFE unit is configured to digitize the received voltage signals. For example, the ADC unit 202 of the AFE unit 106 digitizes the received voltage signal $V_{IA}$.

The method 400 continues in block 412 with transmitting a handshake signal by the AFE unit to the MCU 102, and receiving an acknowledgement signal by the AFE unit. More particularly, the handshake signal is transmitted from the AFE unit to the MCU 102 via the transformer 104. In an example, the handshake signal may enable the MCU 102 to determine whether the AFE unit that transmits the handshake signal has matched information of clock. If the MCU 102 approves the handshake signal, the MCU 102 may transmit an acknowledgment signal to the AFE unit.

Still referring to FIG. 4, after the AFE unit receiving the acknowledgement signal, the method 400 continues at block 414 with transmitting the digitized voltage signals to the MCU 102 via the transformer 104. In some embodiments, the transceiver of each AFE unit is configured to transmit the digitized voltage signals. For example, the transceiver 206 of the AFE unit 106 transmits the digitized voltage signal to the MCU 102 via the transformer 104.

After the MCU 102 receives the digitized voltage signals, the MCU 102 is configured to process the digitized voltage signals and estimate an amount of electric energy of the first phase that has been consumed by the load 120.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. An apparatus for a poly-phase electricity network, comprising:
   a power transformer having a primary side and a secondary side;
   a first plurality of analog front end (AFE) units coupled to the secondary side of the power transformer, each of the first plurality of AFE units is to be coupled to a separate phase of the poly-phase electrical distribution and configured to measure current for that particular phase;
   a second plurality of AFE units coupled to the secondary side of the power transformer, and each of the second AFE units is to be coupled to a separate phase of the poly-phase electricity network and configured to measure voltage for that particular phase; and
   a microcontroller coupled to the primary side of the power transformer and configured to transmit a digitized request signal to each of the first and second AFE units and to receive measurement data from the first and second AFE units via the power transformer;

wherein one of the first plurality of AFE units and one of the second plurality of AFE units are to be coupled to each phase.

2. The apparatus of claim 1 wherein the microcontroller is configured to transmit the digitized request signal respectively to one of the first plurality of AFE units and one of the second plurality of AFEs that are to be coupled to a common phase.

3. The apparatus of claim 2 wherein, upon an AFE unit receiving the digitized request signal, the AFE unit is to extract clock information and data from the digitized request signal.

4. The apparatus of claim 3 wherein each AFE unit further includes a recovery unit that is activated by power of the received digitized request signal, and the AFE unit, upon being activated by its recovery unit, is to extract the clock information and data.

5. The apparatus of claim 4 wherein, based on one of the AFE units of the first plurality of AFE units extracting the clock information and data, such AFE unit is configured to digitize the measured current for the phase to which that AFE unit is to be coupled, and the AFE unit of the second plurality of AFE units to be coupled to the common phase is configured to digitize the measured voltage for the common phase.

6. The apparatus of claim 1 wherein the power transformer is included on a printed circuit board.

7. A method, comprising:
transmitting, by a microcontroller coupled to a primary side of a power transformer, a digitized request signal to a plurality of analog front end (AFE) units, wherein each AFE unit is coupled between a secondary side of the power transformer and one phase of poly-phase electricity network;
upon receiving the digitized request signal, activating the plurality of AFE units;
measuring, by a first AFE unit, a first phase of current of a poly-phase electrical distribution;
measuring, by a second AFE unit, the first phase of voltage of the poly-phase electrical distribution; and
transmitting, by the first and second AFE units, the measured current and voltage for the first phase of the poly-phase electrical distribution to the microcontroller.

8. The method of claim 7 further comprising digitizing, by the AFE units, the measured current and voltage for the first phase before transmitting to the microcontroller.

9. The method of claim 8 further comprising recovering, by the microcontroller, the measured current and voltage for the phase that are transmitted by the first and second AFE units.

* * * * *